United States Patent [19]
Kaizu et al.

[11] Patent Number: 5,471,023
[45] Date of Patent: Nov. 28, 1995

[54] LIGHT ILLUMINATION MEMBRANE SWITCH WITH REDUCED SIZE AND IMPROVED LIGHT ILLUMINATION

[75] Inventors: Masahiro Kaizu; Atsuhiro Horii, both of Chiba, Japan

[73] Assignee: Fujikura Ltd., Tokyo, Japan

[21] Appl. No.: 995,896

[22] Filed: Dec. 23, 1992

[30] Foreign Application Priority Data

| Jan. 22, 1992 | [JP] | Japan | 4-009508 |
| Jan. 24, 1992 | [JP] | Japan | 4-011353 |
| Feb. 10, 1992 | [JP] | Japan | 4-024150 |
| Jun. 11, 1992 | [JP] | Japan | 4-152492 |

[51] Int. Cl.⁶ .................................... H01H 9/00
[52] U.S. Cl. ............... 200/310; 200/292; 200/311; 200/313; 200/314
[58] Field of Search ............... 200/310, 313, 200/314, 317, 311, 512, 514, 516, 520, 312, 292

[56] References Cited

U.S. PATENT DOCUMENTS

| 2,607,873 | 8/1952 | Sheidler | 200/317 |
| 4,343,975 | 8/1982 | Sado | 200/310 |
| 4,460,810 | 7/1984 | Fukukura | 200/5 A |
| 4,636,593 | 1/1987 | Novak et al. | 200/313 |
| 4,638,131 | 1/1987 | Kidd et al. | 200/61.55 |
| 4,670,633 | 6/1987 | Kaiwa et al. | 200/313 |
| 4,774,434 | 9/1988 | Bennion | 313/500 |
| 4,937,408 | 6/1990 | Hattori et al. | 200/314 |

FOREIGN PATENT DOCUMENTS

| 0315905 | 5/1989 | European Pat. Off. . |
| 0358885 | 3/1990 | European Pat. Off. . |
| 0531973 | 3/1993 | European Pat. Off. . |
| 2379379 | 9/1978 | France . |
| 2504721 | 10/1982 | France . |
| 2562713 | 10/1985 | France . |
| 2592221 | 6/1987 | France . |
| 8911792 | 1/1990 | Germany . |
| 61-001066 | 7/1986 | Japan . |
| 1134827 | 5/1989 | Japan . |
| 374961 | 6/1984 | Netherlands . |
| 619333 | 9/1980 | Switzerland . |
| 619333 | 9/1980 | Switzerland . |
| 2065373 | 6/1981 | United Kingdom . |
| 2116777 | 9/1983 | United Kingdom . |
| 2140210 | 11/1984 | United Kingdom . |

OTHER PUBLICATIONS

Design Engineering, Jun. 1987, p. 30, "Flexible Switch Panels Feature Integral Illumination and Power".
Patent Abstract of Japan, vol. 13, No. 383, (E–811)(3731) Aug. 24, 1989, JP–A–01 134 827, May 26, 1989.
Patent Abstracts of Japan, vol. 10, No. 137, (E–405)(2194) May 21, 1986, JP–A–61 001 066, Jan. 7, 1986.

*Primary Examiner*—Henry J. Recla
*Assistant Examiner*—David J. Walczak
*Attorney, Agent, or Firm*—Oblon, Spivak, McClelland, Maier & Neustadt

[57] ABSTRACT

A light illumination membrane switch having a configuration with a reduced size, capable of realizing an effective light illumination of the keys and a highly reliable operation even under the high humidity environment. The switch has a light source section using an LED bare chip element for emitting lights to illuminate the key section which is directly mounted on the electrode circuit member of the printed circuit board. The switch may include a translucent diffuser member having a cavity region for directly transmitting the lights emitted from the light source section to the key section. The switch may include a translucent diffuser member having a side wall portion defining an opening such that the translucent diffuser member and the printed circuit board are assembled together by inserting the printed circuit board into the opening defined by the side wall portion. The switch may include a translucent diffuser member having reflective coating layer formed thereon for reflecting the lights emitted from the light source section into the translucent diffuser member.

4 Claims, 6 Drawing Sheets

LIGHT ILLUMINATION MEMBRANE SWITCH WITH REDUCED SIZE AND IMPROVED LIGHT ILLUMINATION

BACKGROUND OF THE INVENTION

1. Field of the Invention

The present invention relates to a membrane switch used in various electronic devices, incorporating a light illumination of a key top portion by a light emission diode (LED).

2. Description of the Background Art

As a switch unit to be used in various electronic devices, there has been a light illumination membrane switch which incorporates a light illumination of key top portions by LED for the purpose of easier recognition of the key top portions even in a dark environment.

An exemplary configuration of such a conventional light illumination membrane switch is shown in FIG. 1A, which comprises: a surface sheet 2 with key top portions 1 for forming numerical keys thereon; a translucent diffuser member 3 attached below the surface sheet 2; and a printed circuit board 6 having clicking diaphragm spring members 4 located below the key top portions 1, LED chips 5 provided in vicinities of the clicking diaphragm spring members 4, and connection terminal 6' for connecting electrode circuit members (not shown in FIG. 1A) provided below the clicking diaphragm spring members 4 to an external circuits. These surface sheet 2, the translucent diffuser member 3 and the printed circuit board 6 are assembled together to form a thin layered structure as shown in FIG. 1B.

Here, the translucent diffuser member 3 is made of a silicone rubber, and as shown in FIG. 2, this translucent diffuser member 3 has a plurality of concaved portions 4a for housing the clicking diaphragm spring members 4 and a plurality of concaved portions 5a for housing the LED chips 5, on its back side facing toward the printed circuit board 6 in correspondence to the clicking diaphragm spring members 4 and the LED chips 5 provided on a front surface of the printed circuit board 6.

A key section and a light source section of this conventional light illumination membrane switch have a detailed configuration as shown in FIG. 3, in which the printed circuit board 6 comprises an insulative base layer 6a, electrode circuit members 6b, an adhesive layer 6c, and a cover lay polyimide film 6d, all of which are layered together, and the cover lay polyimide film 6d of this printed circuit board 6 is attached to the translucent diffuser member 3 by an adhesive layer 7.

The clicking diaphragm spring members 4 make electrical contacts with the electrode circuit members 6b in response to the depression of the key top portions 1, as the clicking diaphragm spring members 4 located below the key top portions i are convexed downwards in response to the depression of the key top portions 1, and the electrical contacts between the clicking diaphragm spring members 4 and the electrode circuit members 6b can be broken when the depression of the key top portions 1 is released as the clicking diaphragm spring members 4 resume the original upwardly convexed forms, so as to realize an ON/OFF switching function.

The LED chips 5 are commercially available premanufactured chip components, and each of the LED chips 5 has a detailed configuration as shown in FIG. 4, which comprises a substrate 9 made of ceramic such as alumina or resin such as glass epoxy, a LED bare chip element 10 mounted on an upper surface of the substrate 9, an electrode member 11 formed over the substrate 9, a bonding wire loop 12 for electrically connecting a terminal at a top of the LED bare chip element 10 and the electrode member 11, and a translucent diffuser resin 13 covering over the LED bare chip element 10 and the bonding wire loop 12 completely, where this LED chip 5 is mounted on the printed circuit board 6 through conductive soldering 14 such that the electrode circuit member 11 is electrically connected with the electrode circuit members 6b through this conductive soldering 14.

Now, a reduction of a thickness of such a conventional light illumination membrane switch has been limited by the height required for the light source section incorporating the LED chip 5. Namely, the total height of the LED chip 5 is normally about 1.2 mm, and when this LED chip 5 is soldered on the printed circuit board 6, the LED chip 5 is elevated above the electrode circuit members 6b by the conductive soldering 14 for about 0.1 mm. Furthermore, for the sake of the sufficient light illumination from the LED chip 5, it is necessary for the translucent diffuser resin 13 to have a thickness of about 0.3 mm above the LED bare chip element 10. For these reasons, a conventional light illumination membrane switch inevitably has the thickness of at least about 1.6 mm and further reduction of the thickness of a light illumination membrane switch has been practically impossible.

SUMMARY OF THE INVENTION

It is therefore an object of the present invention to provide a light illumination membrane switch having a configuration in a reduced size realizing a further reduction of its thickness.

It is another object of the present invention to provide a light illumination membrane switch capable of realizing an effective light illumination of the key top portions by the LED.

It is another object of the present invention to provide a light illumination membrane switch having such a configuration with a reduced size, capable of realizing a highly reliable operation even under the high humidity environment.

According to one aspect of the present invention there is provided a light illumination membrane switch, comprising: a printed circuit board having electrode circuit member; a key section having a key top portion, the key section being provided over the electrode circuit member to form a switch unit by making an electrical contact with the electrode circuit member in response to a depression of the key top portion; and a light source section provided on the printed circuit board in a vicinity of the key section, including an LED bare chip element for emitting lights to illuminate the key section which is directly mounted on the electrode circuit member of the printed circuit board, and a translucent diffuser resin means covering over the LED bare chip element for diffusing and transmitting the lights emitted from the LED bare chip element.

According to another aspect of the present invention there is provided a light illumination membrane switch, comprising: a printed circuit board having electrode circuit member; a key section having a key top portion, the key section being provided over the electrode circuit member to form a switch unit by making an electrical contact with the electrode circuit member in response to a depression of the key top portion; a light source section provided on the printed circuit board in a vicinity of the key section, including an LED bare chip element for emitting lights to illuminate the key section, and a translucent diffuser resin means covering over the LED bare chip element for diffusing and transmitting the lights emitted from the LED bare chip elements; and translucent diffuser means provided around the key section and the light source section for diffusing and transmitting the lights emitted from the light source section, the translucent diffuser means having a cavity region for directly transmitting the lights emitted from the light source section to the key section.

According to another aspect of the present invention there is provided a light illumination membrane switch, comprising: a printed circuit board having electrode circuit member; a key section having a key top portion, the key section being provided over the electrode circuit member to form a switch unit by making an electrical contact with the electrode circuit member in response to a depression of the key section; a light source section provided on the printed circuit board in a vicinity of the key section, including an LED bare chip element for emitting lights to illuminate the key section, and a translucent diffuser resin means covering over the LED bare chip element for diffusing and transmitting the lights emitted from the LED bare chip element; and translucent diffuser means provided around the key section and the light source section for diffusing and transmitting the lights emitted from the LED bare chip element, the translucent diffuser means having a side wall portion defining an opening such that the translucent diffuser means and the printed circuit board are assembled together by inserting the printed circuit board into the opening defined by the side wall portion.

According to another aspect of the present invention there is provided a light illumination membrane switch, comprising: a printed circuit board having electrode circuit member; a key section having a key top portion, the key section being provided over the electrode circuit member to form a switch unit by making an electrical contact with the electrode circuit member in response to a depression of the key top portion; a light source section provided on the printed circuit board in a vicinity of the key section, including an LED bare chip element for emitting lights to illuminate the key section, and a translucent diffuser resin means covering over the LED bare chip element for diffusing and transmitting the lights emitted from the LED bare chip element; and translucent diffuser means provided around the key section and the light source section for diffusing and transmitting the lights emitted from the light source section, the translucent diffuser means having reflective coating means formed thereon for reflecting the lights emitted from the light source section into the translucent diffuser means.

Other features and advantages of the present invention will become apparent from the following description taken in conjunction with the accompanying drawings.

DETAILED DESCRIPTION OF THE PREFERRED EMBODIMENTS

Figure 5:
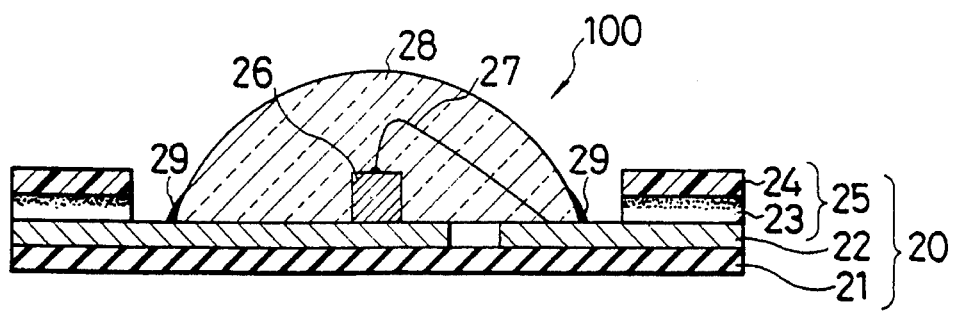
FIG. 5 is a cross sectional view of a light source section of a first embodiment of a light illumination membrane switch according to the present invention.
Figure 6:
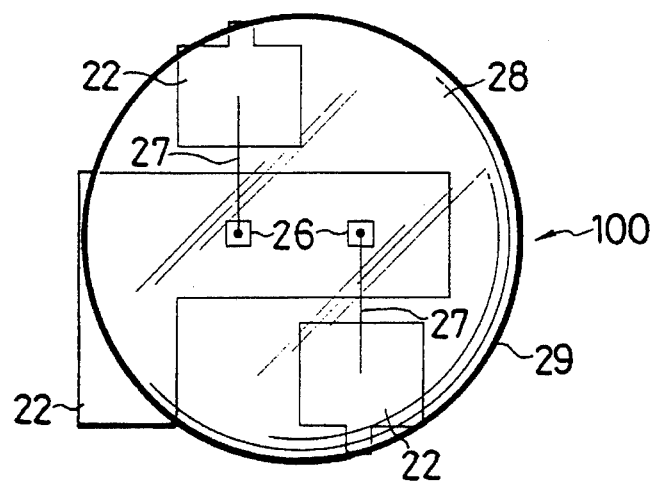
FIG. 6 is a top plan view of the light source section of the light illumination membrane switch shown in FIG. 5.
Figure 7:
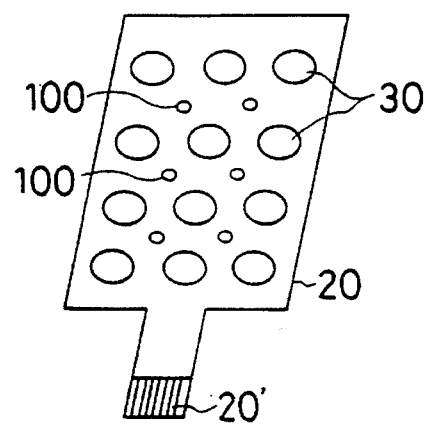
FIG. 7 is a perspective view of an entire flexible printed circuit board for the first embodiment of a light illumination membrane switch shown in FIG. 5.

Referring now to FIG. 5 to FIG. 7, a first embodiment of a light illumination membrane switch according to the present invention will be described in detail.

In this first embodiment, a key section (not shown) of the light illumination membrane switch is essentially similar to that of a conventional light illumination membrane switch, but a light source section of the light illumination membrane switch is formed in a configuration as shown in FIG. 5.

Namely, in this first embodiment, there is provided a flexible printed circuit board 20 comprising: an insulative base layer 21 made of a polyimide film having a thickness equal to 25 μm: an electrode circuit member 22 made of copper foil having a thickness equal to 18 μm; and a cover lay film layer 25, provided around the light source section 100, which includes a cover lay adhesive layer 23 having a thickness equal to 25 μm and a cover lay polyimide film 24 having a thickness equal to 25 μm, all of which are layered together.

The light source section 100 is formed above the electrode circuit member 22 of the flexible printed circuit board 20, and comprises: a monocrystal semiconductor LED bare chip element 26 having a width and a depth equal to 0.25 mm and a height equal to 0.30 mm, which is directly mounted on the electrode circuit member 22 by means of a conductive adhesive such as silver paste; a bonding wire loop 27 for electrically connecting a terminal at a top of the LED bare chip element 26 with the electrode circuit member 22; a translucent diffuser resin 28 made of transparent or opalescent epoxy resin, which is covering over the LED bare chip element 26 and the bonding wire loop 27 completely; and a dam member 29 made of silicone resin or plastic resin, which is formed around the translucent diffuser resin 28 to define an edge of the translucent diffuser resin 28.

An exemplary top plane view of such a light source section 100 according to this first embodiment for a case of incorporating two LED bare chip elements 26 is shown in FIG. 6.

Also, as shown in FIG. 7, in the entire light illumination membrane switch configuration, a plurality of such light source sections 100 are provided on the flexible printed circuit board 20 having a connection terminal 20', and arranged between clicking diaphragm spring members 30 also arranged on the flexible printed circuit board 20.

Figure 1A:
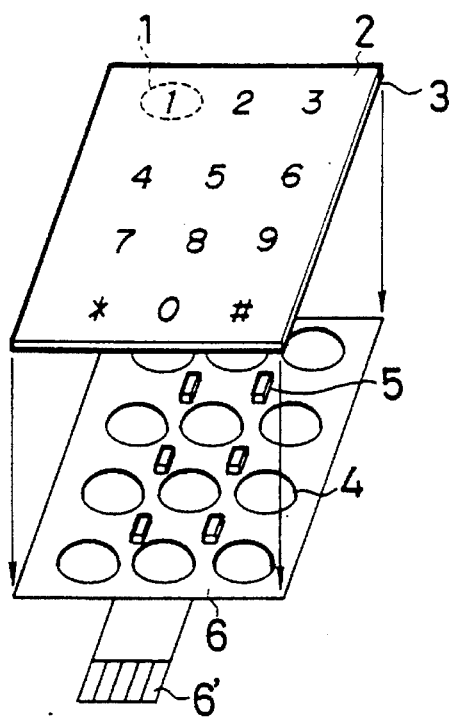
FIG. 1A is an expanded perspective view of an exemplary configuration of a conventional light illumination membrane switch.
Figure 1B:
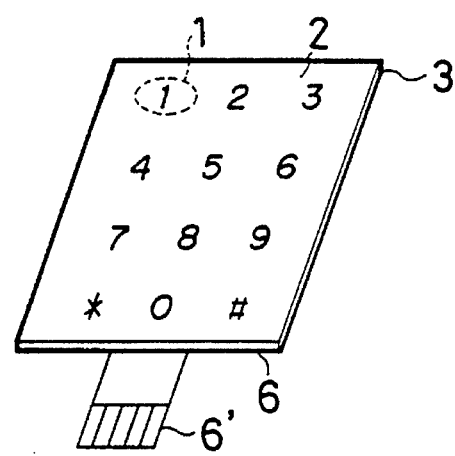
FIG. 1B is a perspective view of the conventional light illumination membrane switch shown in FIG. 1A in an assembled state.
Figure 2:
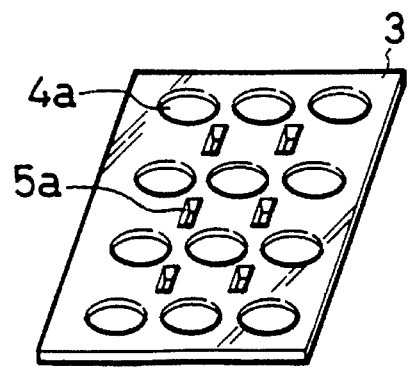
FIG. 2 is a perspective view of a back side of a translucent diffuser member in the conventional light illumination membrane switch shown in FIGS. 1A and 1B.
Figure 3:
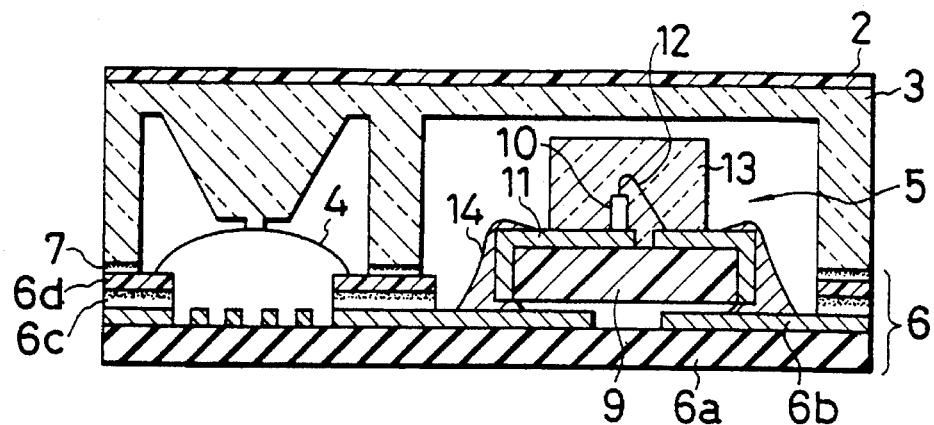
FIG. 3 is a cross sectional view of a key section and a light source section in the conventional light illumination membrane switch shown in FIGS. 1A and 1B.
Figure 4:
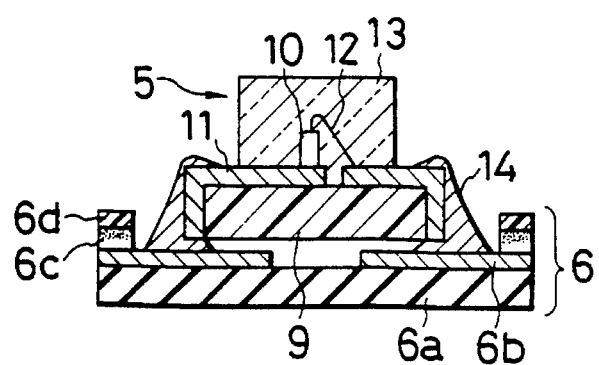
FIG. 4 is an enlarged cross sectional view of an LED chip used in the conventional light illumination membrane switch shown in FIG. 3.

Here, the LED bare chip element 26 having a height equal to 0.3 mm is directly mounted on the electrode circuit member 22 of the flexible printed circuit board 20, so that the top height of the translucent diffuser resin 28 can be set to be about 0.7 mm, and consequently the total thickness of the light source section 100 can be reduced to approximately a half of the thickness of the light source section in a conventional light illumination membrane switch such as that shown in FIG. 3 described above.

Also, an upper surface of the translucent diffuser resin 28 can be shaped into a desired shape by appropriately adjusting a shape of the dam member 29.

Moreover, in this first embodiment, the entire light source section 100 including the LED bare chip element 26 as well as the translucent diffuser resin 28 functions as a light source for providing the light illumination in the light illumination membrane switch, so that the effective light illumination can be realized.

In addition, by limiting the size of the edge of the translucent diffuser resin 28 by means of the dam member 29, the size of the light source section 100 can be made smaller, and consequently, the size of the entire light illumination membrane switch can be reduced.

Furthermore, as each individual LED bare chip element 26 has a very compact size, it becomes possible to arrange more than one LED bare chip elements 26 for emitting lights in different colors within a single light source section 100, such that the light illumination with variously colored lights can be realized in a compact configuration of the light illumination membrane switch.

Figure 8:
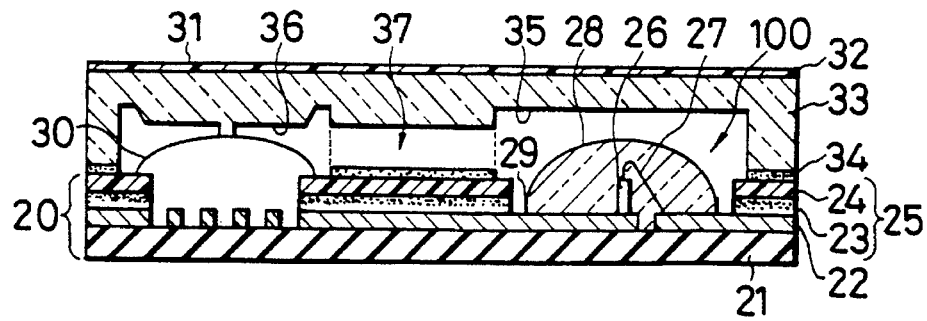
FIG. 8 is a cross sectional view of a key section and a light source section of a second embodiment of a light illumination membrane switch according to the present invention.
Figure 9:
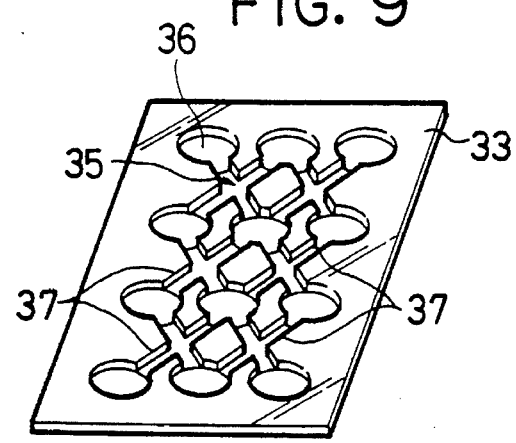
FIG. 9 is a perspective view of an entire translucent diffuser member for the second embodiment of a light illumination membrane switch shown in FIG. 8.

Referring now to FIG. 8 and FIG. 9, a second embodiment of a light illumination membrane switch according to the present invention will be described in detail. Here, those elements which are substantially equivalent to the corresponding elements in the first embodiment described above will be given the same reference numerals in the drawings and their description will be omitted.

In this second embodiment, a key section and a light source section of the light illumination membrane switch comprise: a surface sheet 32 with key top portions 31 for forming desired alphanumeric keys thereon; a translucent diffuser member 33 attached below the surface sheet 32; the flexible printed circuit board 20 similar to that used in the first embodiment described above, which is attached below the translucent diffuser member 33 by means of an adhesive layer 34; clicking diaphragm spring members 30 located on the flexible printed circuit board 20 below the key top portions 1; and the light source section 100 similar to that of the first embodiment described above.

Here, the surface sheet 32 and the translucent diffuser member 33 may be formed integrally if desired. Also, the surface sheet 32 may be provided as a part of a casing of an electronic device to which this light illumination membrane switch is to be incorporated.

As shown in FIG. 9, the translucent diffuser member 33 has a plurality of concaved portions 36 for housing the clicking diaphragm spring members 30, a plurality of concaved portions 35 for housing the light source section 100, and grooves 37 connecting the neighboring ones of the concaved portions 36 and the concaved portions 35, on its back side facing toward the flexible printed circuit board 20 in correspondence to the clicking diaphragm spring members 30 and the light source sections 100 provided on a front surface of the flexible printed circuit board 20.

The clicking diaphragm spring members 30 make electrical contacts with the electrode circuit members 22 in response to the depression of the key top portions 31, as the clicking diaphragm spring members 30 located below the key top portions 81 are convexed downwards in response to the depression of the key top portions 31, and the electrical contacts between the clicking diaphragm spring members 30 and the electrode circuit members 22 can be broken when the depression of the key top portions 31 is released as the clicking diaphragm spring members 30 resume the original upwardly convexed forms, so as to realize an ON/OFF switching function.

The entire light illumination membrane switch is assembled by properly aligning the surface sheet 32 attached to the translucent diffuser member 33 with the flexible printed circuit board 20 having the clicking diaphragm spring members 30 and the light source sections 100 provided thereon, and attaching them together by means of the adhesive layer 34.

Now, in this second embodiment, the grooves 37 provided in the translucent diffuser member 33 effectively function as cavities to transmit the light emitted from each of the light source sections 100 to the neighboring key sections directly without significant dissipation, so that it becomes possible to realize the effective light illumination in this light illumination membrane switch.

As a consequence, the intensity of the light to be emitted from the LED bare chip element 26 of each light source section 100 required in illuminating the key top portions 31 at a prescribed luminance can be smaller than that required in a conventional light illumination membrane switch, so that the light illumination membrane switch itself can be made to be less power consuming.

In addition, the grooves 37 provided in the translucent diffuser member 33 also function as escape rooms for the air inside the key sections when the key top portions 31 are depressed, so that the improved key touch can be realized at the key top portions 31 as the extra resistance against the depression of the key top portions 31 due to the air pressure of the air inside the key sections can be reduced in this light illumination membrane switch.

It should be apparent that the same advantages as in the first embodiment described above can also be achieved as the light source sections 100 similar to that in the first embodiment are used in this second embodiment.

Figure 10:
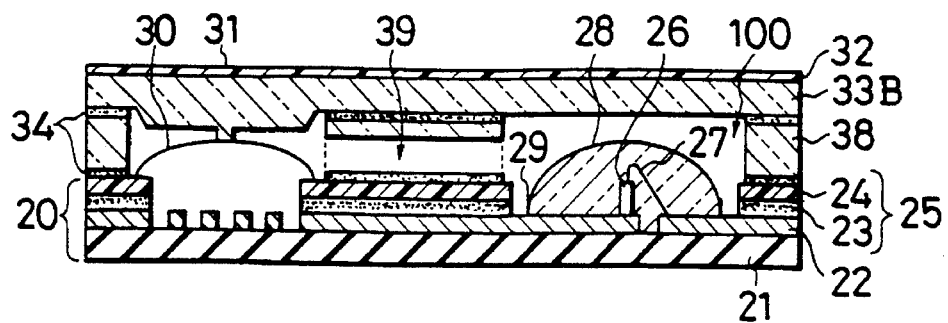
FIG. 10 is a cross sectional view of a key section and a light source section of a third embodiment of a light illumination membrane switch according to the present invention.

Referring now to FIG. 10, a third embodiment of a light illumination membrane switch according to the present invention will be described in detail. Here, those elements which are substantially equivalent to the corresponding elements in the first and second embodiments described above will be given the same reference numerals in the drawings and their description will be omitted.

This third embodiment is a modification of the second embodiment described above, and as shown in FIG. 10, in this third embodiment, the translucent diffuser member 33B is formed in a substantially plate like shape and made of silicone rubber sheet, and between this translucent diffuser member 33B and the flexible printed circuit board 20, there is provided additional translucent diffuser member 38 made of polycarbonate which is attached between the translucent diffuser member 33B and the flexible printed circuit board 20 by means of adhesive layers 34, where this additional translucent diffuser member 38 has grooves 39 connecting the neighboring ones of the key sections and the light source sections, just as the grooves 37 provided in the translucent diffuser member 33B in the second embodiment described above. The remaining features of this third embodiment are substantially similar to those of the second embodiment described above.

Here, the light illumination in this third embodiment can be further improved by using the additional translucent diffuser member 38 which is substantially transparent and providing a surface coating in white or silver on an upper surface of the additional translucent diffuser member 38 as well as on the upper surface of the cover lay polyimide film 24, so as to improve the light transmission from the light source section to the key section.

It should be apparent that the same advantages as in the first and second embodiments described above can also be achieved in this third embodiment.

Figure 11:
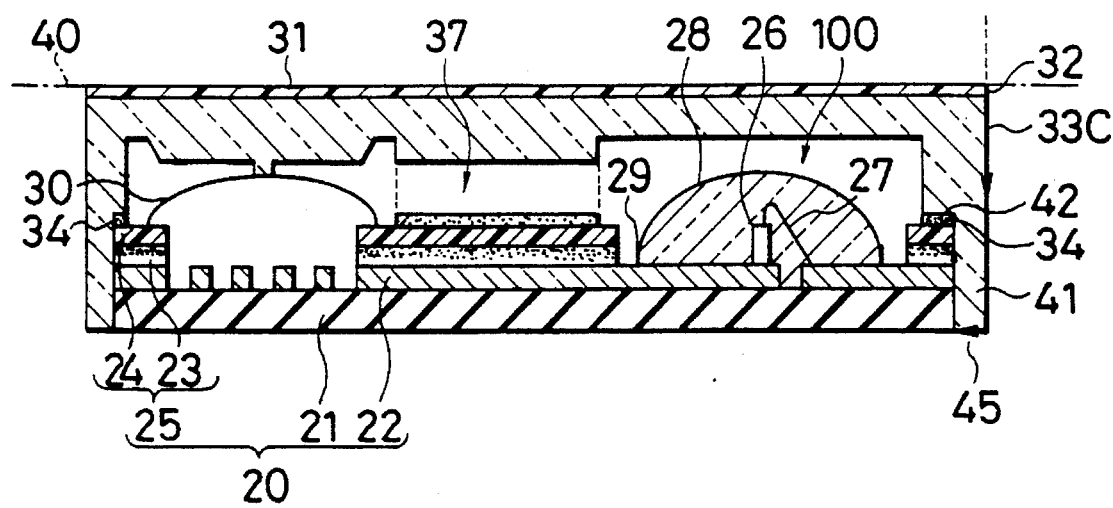
FIG. 11 is a cross sectional view of a key section and a light source section of a fourth embodiment of a light illumination membrane switch according to the present invention.
Figure 12:
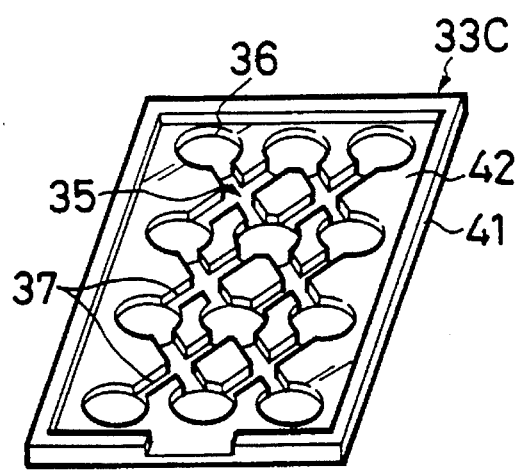
FIG. 12 is a perspective view of an entire translucent diffuser member for the fourth embodiment of a light illumination membrane switch shown in FIG. 11.

Referring now to FIG. 11 and FIG. 12, a fourth embodiment of a light illumination membrane switch according to the present invention will be described in detail. Here, those elements which are substantially equivalent to the corresponding elements in the first and second embodiments described above will be given the same reference numerals in the drawings and their description will be omitted.

This fourth embodiment is another modification of the second embodiment described above, and as shown in FIG. 11 and FIG. 12, in this fourth embodiment, the light illumination membrane switch is installed in an electronic device body 40, and the translucent diffuser member 33C is formed to have a side wall portion 41 and an indented portion 42 surrounded by the side wall portion 41, where the inner size of an opening defined by the side wall portion 41 corresponding to the outer size of the flexible printed circuit board 20, such that the flexible printed circuit board 20 can be inserted into the opening defined by the side wall portion 41 of the translucent diffuser member 33 and adhered to the indented portion 42 by means of the adhesive layer 34. The remaining features of this third embodiment are substantially similar to those of the second embodiment described above.

Here, because of this side wall portion 41 of the translucent diffuser member 33, the alignment of the flexible printed circuit board 20 with respect to the translucent diffuser member 33 can be made easily by simply fitting the flexible printed circuit board 20 into the opening defined by the side wall portion 41 of the translucent diffuser member 33.

On the other hand, as the flexible printed circuit board 20 is tightly fitted into the opening defined by the side wall portion 41 of the translucent diffuser member 33, the possible curving of the translucent diffuser member 33 itself can be adjusted.

Moreover, the flexible printed circuit board 20 is tightly fitted into the opening defined by the side wall portion 41 of the translucent diffuser member 33 while the translucent diffuser member 33 itself has a significant water repellency, and in addition the possible route for invasion of the moisture and dust through the border of the flexible printed circuit board 20 and the translucent diffuser member 33 indicated by an arrow 45 in FIG. 11 is complicated, so that invasion of the moisture and dust through the border of the flexible printed circuit board 20 and the translucent diffuser member 33 due to the capillary phenomenon can be effectively prevented.

For this reason, this light illumination membrane switch of the fourth embodiment is capable of realizing a highly reliable operation and improved durability even under the high humidity environment or in a case of water leakage.

It should be apparent that the same advantages as in the first and second embodiments described above can also be achieved in this fourth embodiment.

Figure 13:
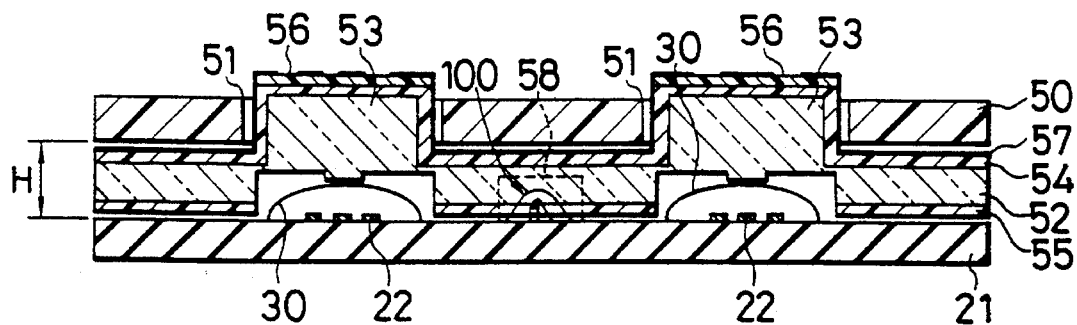
FIG. 13 is a cross sectional view of key sections and a light source section of a fifth embodiment of a light illumination membrane switch according to the present invention.
Figure 14:
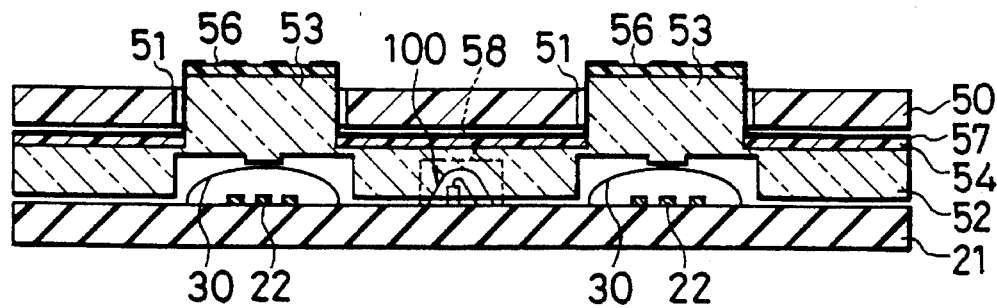
FIG. 14 is a cross sectional view of key sections and a light source section of one variation of the fifth embodiment of a light illumination membrane switch shown in FIG. 13.

Referring now to FIG. 13 and FIG. 14, a fifth embodiment of a light illumination membrane switch according to the present invention will be described in detail. Here, those elements which are substantially equivalent to the corresponding elements in the first and second embodiments described above will be given the same reference numerals in the drawings and their description will be omitted.

In this fifth embodiment, as shown in FIG. 13, the light illumination membrane switch comprises: an outer casing 50 having openings 51 corresponding to keys; a sheet shaped keypad 52 made of translucent rubber material such as silicone rubber, which is located between the outer casing 50 and the insulative base layer 21 and which has key portions 53 projecting out from a sheet shaped body of the keypad 52 into the openings 51 of the outer casing 50 and a light source section housing 58 for housing the light source section 100; upper and lower reflective coating layers 54 and 55 formed on upper and lower sides of the keypad 52 by using a paint medium in white or silver having a significant reflectivity; a colored paint layer 56 formed on top surfaces of the key portions 53; and a black paint layer 57 formed over the upper reflective coating layer 54 and the colored paint layer 56, where the black paint layer 77 over the colored paint layer 56 is partially removed by laser etching process to expose the colored paint layer 56 in shapes of the desired alphanumeric figures.

The key sections also includes the electrode circuit members 22 and the clicking diaphragm spring members 30 similar to those of the second embodiment described above, which are formed below the key portions 53 of the keypad 52, while the light source sections 100 similar to those of the first and second embodiments described above are formed inside the light source section housing 58 provided inside the sheet shaped body of the keypad 52.

Here, the light emitting portion of the LED bare chip element in the light source section 100 is located below the upper reflective coating layer 54 and above the lower reflective coating layer 55, such that the lights emitted from the light source section 100 are transmitted through the keypad 52 while being repeatedly reflected between the upper and lower reflective coating layers 54 and 55, until they reach to the key portions 53 to illuminate the colored paint layer 56.

In this fifth embodiment, the keypad 52 fulfills the functions of both the surface sheet and the translucent diffuser member in the second embodiment described above, so that the height H between the outer casing 50 and the insulative base layer 21 can be further reduced compared with the second embodiment described above. Consequently, a further reduction of an overall thickness of the entire light illumination membrane switch can be realized. In fact, by means of this configuration, it becomes possible for this light illumination membrane switch of the fifth embodiment to realize the overall thickness in a range of 0.5 mm to 1.5 mm.

Moreover, by forming the reflective coating layers 54 and 55 from the paint medium in white, it is possible to subdue the color difference between the lights emitted by the LED bare chip element in the light source section 100 and the colored paint layer 56.

It is to be noted that the similar advantageous effect can also be obtained to lesser extent by omitting the lower reflective coating layer 55 and limiting the upper reflective coating layer 54 to regions between the neighboring key sections, as shown in FIG. 14.

As described above, according to the present invention it becomes possible to provide a light illumination membrane switch with a thickness much smaller than a conventional light illumination membrane switch.

Moreover, according to the present invention, such a thin light illumination membrane switch can be made to be able to realize an effective light illumination of the keys, and a highly reliable operation even under the high humidity environment.

It is to be noted that besides those already mentioned above, many modifications and variations of the above embodiments may be made without departing from the novel and advantageous features of the present invention. Accordingly, all such modifications and variations are intended to be included within the scope of the appended claims.

What is claimed is:

1. A light illumination membrane switch, comprising:

a flexible printed circuit board including an insulative base layer, electrode layer, adhesive layer, and polyimide film laminated in that order;

a bare LED element submerged within a space having the polyimide layer and the adhesive layer for walls, the bare LED element mounted directly on the electrode layer;

a bonding wire having an end attached to the bare LED element and having another end attached to the electrode layer;

a dam structure positioned on the electrode layer and surrounding the bare LED element for defining a lip of translucent diffuser resin; and translucent diffuser resin deposited in the dam structure which entirely covers and is in contact with the bare LED element and the bonding wire.

2. A light illumination membrane switch according to claim 1, further comprising:

key top portions;

a plurality of light illumination membrane switches, each switch adjacent to at least one of the key top portions.

3. A light illumination membrane switch according to claim 1, wherein:

the thickness of the membrane is in the range of 0.5 mm to 1.5 mm.

4. A light illumination membrane switch, comprising:

a printed circuit board having an electrode circuit member;

a key section having a key top portion, the key section being provided over the electrode circuit member for forming a switch unit by making an electrical contact with the electrode circuit member in response to a depression of the key top portion;

a light source section provided on the printed circuit board in a vicinity of the key section, including an LED bare chip element for emitting lights to illuminate the key section which is directly mounted on the electrode circuit member of the printed circuit board, and a translucent diffuser resin means covering over the LED bare chip element for diffusing and transmitting the lights emitted from the LED bare chip element; and a dam member provided around the translucent diffuser resin means for defining an edge of the translucent diffuser resin means.

\* \* \* \* \*